United States Patent
Cho et al.

(10) Patent No.: US 7,714,330 B2
(45) Date of Patent: May 11, 2010

(54) SI NANOWIRE SUBSTRATE

(75) Inventors: Hans S. Cho, Seoul (KR); Takashi Noguchi, Seongnam-si (KR); Wenxu Xianyu, Yongin-si (KR); Do-Young Kim, Suwon-si (KR); Huaxiang Yin, Yongin-si (KR); Xiaoxin Zhang, Yongin-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 18 days.

(21) Appl. No.: 11/889,471

(22) Filed: Aug. 14, 2007

(65) Prior Publication Data
US 2007/0287238 A1 Dec. 13, 2007

Related U.S. Application Data

(62) Division of application No. 11/341,519, filed on Jan. 30, 2006, now Pat. No. 7,297,615.

(30) Foreign Application Priority Data
May 13, 2005 (KR) .................. 10-2005-0040165

(51) Int. Cl.
*H01L 29/04* (2006.01)
(52) U.S. Cl. .................. 257/64; 257/66; 257/75; 257/347; 257/E21.133; 257/E27.112
(58) Field of Classification Search .............. 117/4; 977/762, 814, 900, 932, 936, 938, 940, 943; 257/347, E27.112, 64, 66, 75, E21.133
See application file for complete search history.

(56) References Cited

U.S. PATENT DOCUMENTS

| | | | | |
|---|---|---|---|---|
| 5,273,921 A | * | 12/1993 | Neudeck et al. | 438/157 |
| 5,886,380 A | * | 3/1999 | Nakajima | 257/321 |
| 6,121,157 A | * | 9/2000 | Nakajima | 438/737 |
| 6,204,517 B1 | * | 3/2001 | Wu | 257/51 |
| 6,391,695 B1 | * | 5/2002 | Yu | 438/166 |
| 6,699,779 B2 | * | 3/2004 | Chen et al. | 438/607 |
| 6,847,069 B2 | * | 1/2005 | Park et al. | 257/288 |
| 6,897,098 B2 | * | 5/2005 | Hareland et al. | 438/128 |
| 6,919,238 B2 | * | 7/2005 | Bohr | 438/166 |

(Continued)

FOREIGN PATENT DOCUMENTS

JP 05326942 A * 12/1993

*Primary Examiner*—Anh Phung
*Assistant Examiner*—Michael Lulis
(74) *Attorney, Agent, or Firm*—Harness, Dickey & Pierce, P.L.C.

(57) ABSTRACT

A silicon nanowire substrate having a structure in which a silicon nanowire film having a fine line-width is formed on a substrate, a method of manufacturing the same, and a method of manufacturing a thin film transistor using the same. The method of manufacturing the silicon nanowire substrate includes preparing a substrate, forming an insulating film on the substrate, forming a silicon film on the insulating film, patterning the insulating film and the silicon film into a strip shape, reducing the line-width of the insulating film by undercut etching at least one lateral side of the insulating film, and forming a self-aligned silicon nanowire film on an upper surface of the insulating film by melting and crystallizing the silicon film.

7 Claims, 16 Drawing Sheets

U.S. PATENT DOCUMENTS

| | | | |
|---|---|---|---|
| 6,998,333 B2 * | 2/2006 | Chen et al. | 438/607 |
| 7,084,020 B2 * | 8/2006 | Park et al. | 438/164 |
| 7,109,072 B2 | 9/2006 | Saito et al. | 438/149 |
| 7,145,246 B2 * | 12/2006 | Hareland et al. | 257/775 |
| 7,294,539 B2 * | 11/2007 | Kanemoto | 438/166 |
| 2001/0001716 A1 * | 5/2001 | Joo et al. | 438/151 |
| 2004/0005747 A1 | 1/2004 | Park et al. | 438/197 |
| 2004/0084691 A1 * | 5/2004 | Chen et al. | 257/192 |
| 2006/0145136 A1 * | 7/2006 | Verhoeven | 257/14 |
| 2008/0246158 A1 * | 10/2008 | Mascolo et al. | 257/773 |
| 2009/0176353 A1 * | 7/2009 | Plummer et al. | 438/481 |
| 2009/0191680 A1 * | 7/2009 | Walker | 438/283 |

* cited by examiner

SI NANOWIRE SUBSTRATE

DOMESTIC PRIORITY STATEMENT

This application is a divisional of U.S. application Ser. No. 11/341,519, filed on Jan. 30, 2006, now U.S. Pat. No. 7,297,615 and claims priority thereto under 35 U.S.C. §120, the entire contents of which are incorporated herein by reference.

FOREIGN PRIORITY STATEMENT

This application claims priority under 35 U.S.C. §119 to Korean Patent Application No. 10-2005-0040165, filed on May 13, 2005 in the Korean Intellectual Property Office (KIPO), the entire contents of which are incorporated herein by reference.

BACKGROUND

1. Field of the Invention

Example embodiments of the present invention relate to a method of manufacturing a silicon nanowire film, and more particularly, to a silicon nanowire substrate having a structure in which a silicon nanowire film having a fine line-width is formed on a substrate, and a method of manufacturing the same, and a method of manufacturing a thin film transistor using the same.

2. Description of the Related Art

Poly crystalline silicon (poly-Si) may be applied to various electronic devices, for example, flat display devices and solar cells, as a result of having a higher mobility than amorphous silicon (a-Si). However, poly crystalline silicon has lower mobility and uniformity than single crystalline silicon. Single crystalline silicon may be useful in a system on panel (SOP) structure in which a system is formed on the display panel itself, and may have a mobility of more than 300 cm$^2$/Vs. Single crystalline silicon allows the manufacture of improved quality switching devices required for higher performance display devices.

Recently, to comply with stricter miniaturization requirements and higher performance devices, nano scale devices have been developed. To manufacture nano scale devices, nanowire forming techniques have been developed. A nanowire may be defined as an ultra fine line having a cross-sectional diameter of a few nanometers to a few tens of nanometers. Nanowires may be utilized in many fields, for example, laser, transistors, memories and chemical detecting sensors. Naowire materials may include carbon nanotubes (CNT), CdTe, $ZnO_2$, and/or SiGe.

Methods of manufacturing nanowires may be difficult and complicated. A crystal growth inducing method may be used to grow nanowires, but this method may only provide nanowire crystals grown perpendicular to a substrate, and a nanowire grown by such a method may have many impurities. In some cases, location control of the nanowire is needed, which conventional methods may have difficulty providing. Unlike crystal growth inducing methods that uses a catalyst, a nanowire may also be manufactured by lithography, in order to control their horizontal location. However, the conventional lithographic resolution limit is approximately 30 nm. Therefore, the manufacture of a nanowire having a line-width of 30 nm or less is difficult.

SUMMARY

Example embodiments of the present invention provide a silicon nanowire substrate having a structure in which a silicon nanowire film having a line-width is formed on a substrate, a method of manufacturing the same, and a method of manufacturing a thin film transistor using the same.

According to an example embodiment of the present invention, there is provided a silicon nanowire substrate including a substrate, an insulating film formed on the substrate in a strip shape, and a silicon nanowire film covering an upper surface of the insulating film.

In an example embodiment, the insulating film and the silicon nanowire film may have the same line-width, which may be 30 nm or less. In an example embodiment, the silicon nanowire film may have a length in the range of 100 to 10000 nm. In an example embodiment, the substrate may be formed of at least one material selected from the group consisting of silicon, oxidized silicon, quartz, glass, sapphire, and plastic. In an example embodiment, the insulating film may be formed of at least one material selected from SiN or $SiO_2$, and the silicon nanowire film may be single crystalline silicon.

According to another example embodiment of the present invention, there is provided a silicon nanowire substrate including a single crystalline silicon substrate, an insulating film formed on the single crystalline silicon substrate in a strip shape, a silicon crystal seed which is epitaxially grown on the single crystalline silicon substrate and contacts one end of the insulating film, and a silicon nanowire film, which is laterally crystallized from the silicon crystal seed, covers the upper surface of the insulating film, and has an extension part which contacts the silicon crystal seed.

In an example embodiment, the insulating film and the silicon nanowire film may have the same line-width, which may be 30 nm or less. In an example embodiment, the silicon nanowire film may have a length in the range of 100 to 10000 nm. In an example embodiment, the insulating film may be formed of at least one material selected from SiN and $SiO_2$, and the insulating film may comprise a $SiO_2$ film and a SiN film sequentially stacked on the single crystalline silicon substrate. In an example embodiment, the silicon nanowire film may be single crystalline silicon.

According to an example embodiment of the present invention, there is provided a method of manufacturing a silicon nanowire substrate, including preparing a substrate, forming an insulating film on the substrate, forming a silicon film on the insulating film, patterning the insulating film and the silicon film into a strip shape, reducing the line-width of the insulating film by undercut etching at least one lateral side of the insulating film, and forming a self-aligned silicon nanowire film on the upper surface of the insulating film by melting and crystallizing the silicon film.

In an example embodiment, the patterning of the insulating film may include patterning the insulating film and the silicon film to the same line-width, which may be in the range of 20 to 300 nm. In an example embodiment, the patterning of the insulating film and/or the silicon film may be performed by reactive ion etching.

In an example embodiment, the substrate may be formed of at least one material selected from the group consisting of silicon, oxidized silicon, quartz, glass, sapphire, and plastic. In an example embodiment, the insulating film may be formed of at least one material selected from SiN or $SiO_2$. In an example embodiment, the lateral etching of the insulating film may be performed by isotropic dry etching and/or the silicon film may be melted by laser annealing. In crystallizing the silicon film, the nucleation rate of crystallizing silicon may be 1 event/µs or less.

In an example embodiment, the line-width of the silicon nanowire film self-aligned on the insulating film may be controlled by controlling the line-width of the insulating film, and the silicon nanowire film may have a line-width of 30 nm or less. In an example embodiment, the silicon nanowire film may have a length in the range of 100 to 10000 nm and the silicon nanowire film may be single crystalline silicon.

According to another example embodiment of the present invention, there is provided a method of manufacturing a silicon nanowire substrate, including preparing a single crystalline silicon substrate, forming an insulating film on the single crystalline silicon substrate, exposing the single crystalline silicon substrate by etching a region of the insulating film, forming a silicon crystal seed on the exposed surface of the single crystalline silicon substrate by epitaxially growing silicon, forming a silicon film on the upper surface of the insulating film, patterning the insulating film and the silicon film formed on the insulating film into a strip shape of which one end part contacts the silicon crystal seed, reducing the line-width of the insulating film by undercut etching at least one lateral side of the insulating film and the silicon crystal seed; melting the silicon film formed on the upper surface of the insulating film and the silicon crystal seed, and forming a self-aligned silicon nanowire film on the upper surface of the insulating film by laterally crystallizing the silicon film from the silicon crystal seed.

In an example embodiment, the patterning of the insulating film may include patterning the insulating film and the silicon film to have the same line-width, which may be in the range of 20 to 300 nm. In an example embodiment, the patterning of the insulating film and/or the silicon film may be performed by reactive ion etching. In an example embodiment, the exposing of the single crystalline silicon substrate by etching a region of the insulating film may be performed by reactive ion etching. In an example embodiment, the insulating film may be formed of at least one material selected from SiN or $SiO_2$, and the insulating film may comprise a $SiO_2$ film and a SiN film sequentially stacked on the single crystalline silicon substrate.

In an example embodiment, the lateral etching of the insulating film may be performed by isotropic dry etching, and the silicon film may be melted by laser annealing. In crystallizing the silicon film, the nucleation rate of crystallizing silicon may be 1 event/μs or less.

In an example embodiment, the line-width of the silicon nanowire film self-aligned on the insulating film may be controlled by controlling the line-width of the insulating film, and the silicon nanowire film may have a line-width of 30 nm or less. In an example embodiment, the silicon nanowire film may have a length in the range of 100 to 10000 nm, and the silicon nanowire film may be single crystalline silicon.

According to an example embodiment of the present invention, there is provided a method of manufacturing a thin film transistor, including preparing a substrate, forming an insulating film on the substrate, forming a silicon film on the insulating film, patterning the insulating film and the silicon film into a strip shape, reducing the line-width of the insulating film by undercut etching at least one lateral side of the insulating film, forming a self-aligned silicon nanowire film on the upper surface of the insulating film by melting and crystallizing the silicon film, defining a source region, a drain region, and a channel region on the silicon nanowire film, sequentially forming a gate insulating film and a gate electrode on the channel region, and doping the source and drain regions with a conductive dopant.

According to another example embodiment of the present invention, there is provided a method of manufacturing a thin film transistor, including preparing a single crystalline silicon substrate, forming an insulating film on the single crystalline silicon substrate, exposing the single crystalline silicon substrate by etching a region of the insulating film, forming a silicon crystal seed on the exposed surface of the single crystalline silicon substrate by epitaxially growing silicon, forming a silicon film on the upper surface of the insulating film and the silicon crystal seed, patterning the insulating film and the silicon film formed on the insulating film into a strip shape of which one end part contacts the silicon crystal seed, reducing the line-width of the insulating film by undercut etching at least one lateral side of the insulating film, melting the silicon film formed on the upper surface of the insulating film and the silicon crystal seed, and forming a self-aligned silicon nanowire film on the upper surface of the insulating film by laterally crystallizing the silicon film from the silicon crystal seed, cutting the silicon nanowire film to a desired length, defining a source region, a drain region, and a channel region on the silicon nanowire film, sequentially forming a gate insulating film and a gate electrode on the channel region, and doping the source and drain regions with a conductive dopant.

In an example embodiment, the gate insulating film may be formed of at least one material selected from $SiO_2$ and $HfO_2$, and the gate electrode may be formed of a metal.

In an example embodiment, the silicon nanowire film manufacturing process may be simpler, and the location of the silicon nanowire film can be readily controlled.

BRIEF DESCRIPTION OF THE DRAWINGS

The above and other features and advantages of example embodiments of the present invention will become more apparent by describing in detail exemplary embodiments thereof with reference to the attached drawings in which.

DETAILED DESCRIPTION OF EXAMPLE EMBODIMENTS OF THE PRESENT INVENTION

Figure 1:
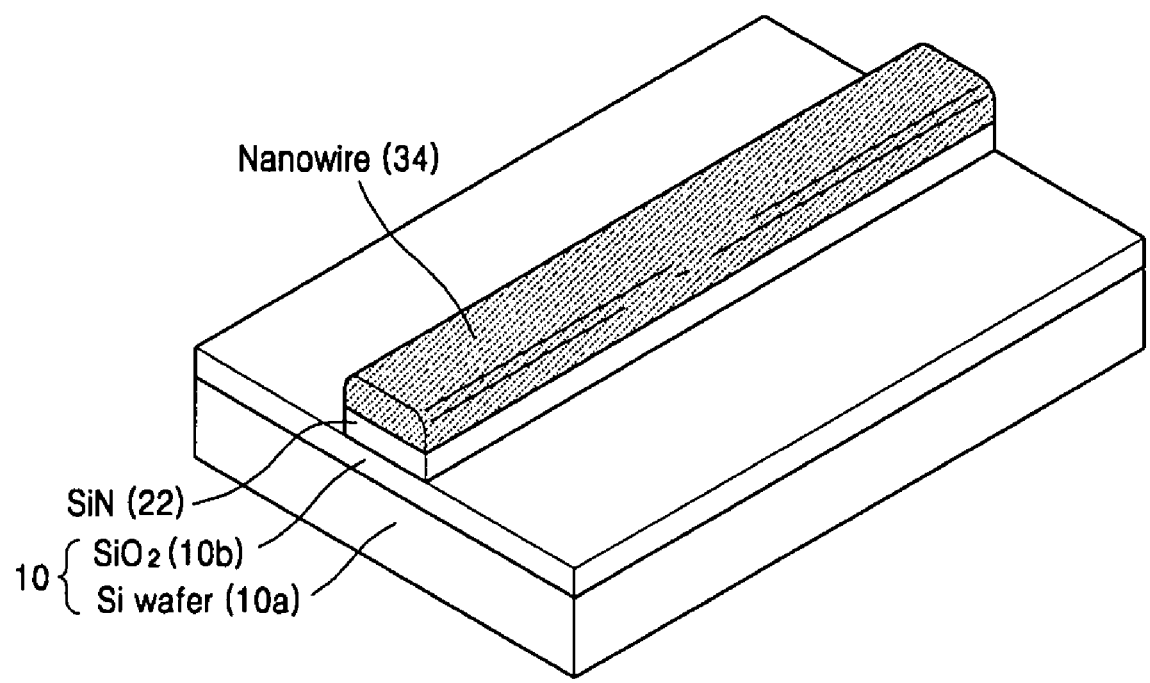
FIG. 1 is a perspective view illustrating a silicon nanowire substrate according to an example embodiment of the present invention.

The present invention will now be described more fully with reference to the accompanying drawings, in which exemplary embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

FIG. 1 is a perspective view illustrating a silicon nanowire substrate according to an example embodiment of the present invention.

Referring to FIG. 1, a silicon nanowire substrate according to an example embodiment of the present invention may include a substrate 10, an insulating film 22 formed in a strip shape on the substrate 10, and/or a silicon nanowire film 34 covering the insulating film 22. In an example embodiment, the substrate 10 may be an oxidized Si substrate and the oxidized Si substrate 10 may include a Si wafer 10a and a SiO$_2$ layer 10b formed on the Si wafer 10a. The insulating film 22 may be formed of SiN or SiO$_2$, and the silicon nanowire film 34 may be single crystalline. In an example embodiment, the SiN insulating film 22 has high interface contact with the silicon nanowire film 34.

In an example embodiment, the insulating film 22 and the silicon nanowire film 34 have the same line-width of 30 nm or less. In an example embodiment, the silicon nanowire film 34 has a length of 100-10000 nm.

In an example embodiment, the substrate 10 may be formed of at least one material selected from the group consisting of silicon, oxidized silicon, quartz, glass, sapphire, and plastic.

In an example embodiment, the silicon nanowire substrate having the above structure may readily provide a silicon nanowire film having a line-width of 30 nm or less, beyond the conventional lithographic resolution limit. In an example embodiment, the location of the silicon nanowire film on the substrate 10 may be readily controlled, and the silicon nanowire film can be used for a channel of a thin film transistor. In an example embodiment, a single crystalline silicon nanowire film has a smaller parasitic capacitance and/or a higher carrier mobility. Accordingly, a single crystalline silicon nanowire film may be used as a transistor channel of a next generation transistor having improved device characteristics.

Figure 2:
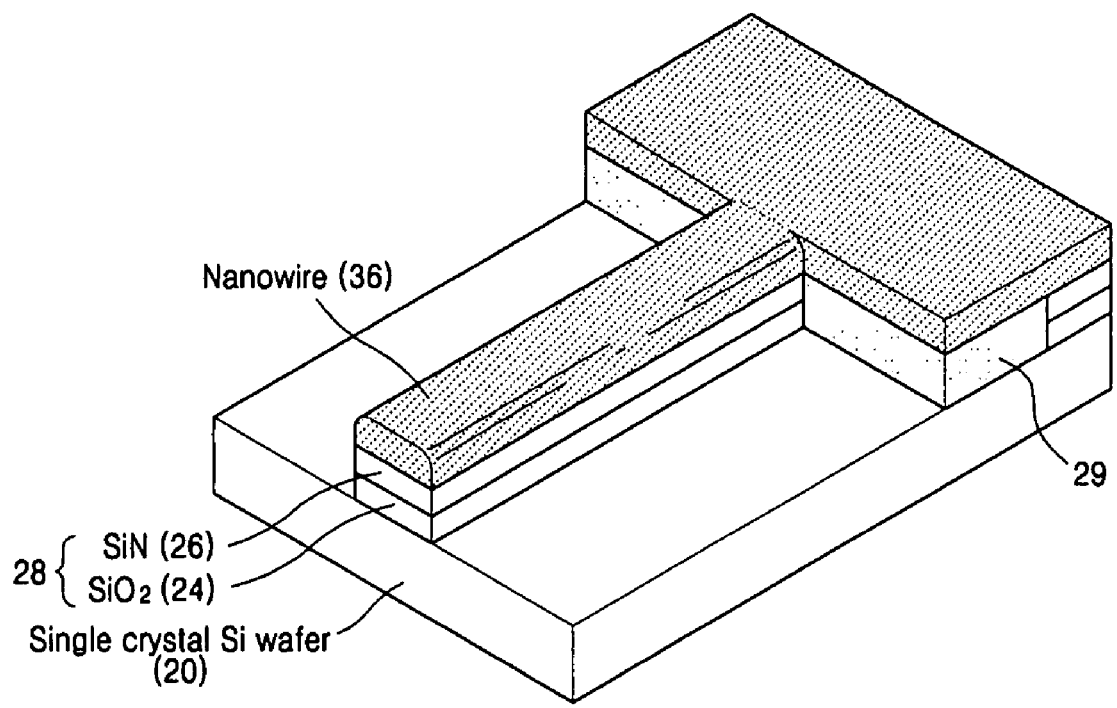
FIG. 2 is a perspective view illustrating a silicon nanowire substrate according to another example embodiment of the present invention.

FIG. 2 is a perspective view illustrating a silicon nanowire substrate according to another example embodiment of the present invention.

Referring to FIG. 2, a silicon nanowire substrate according to another example embodiment of the present invention may include a single crystalline silicon substrate 20, an insulating film 28 formed in a strip shape on the single crystalline silicon substrate 20, a silicon crystal seed 29 which may be epitaxially grown on the single crystalline silicon substrate 20 and contacts an end part of the insulating film 28, and/or a silicon nanowire film 36 that may cover the insulating film 28 and has an extension part which contacts the silicon crystal seed 29. In an example embodiment, the silicon nanowire film 36 is laterally crystallized from the silicon crystal seed 29. In an example embodiment, the silicon nanowire film 36 may be single crystalline.

In an example embodiment, the insulating film 28 may be formed of SiN or SiO$_2$. In an example embodiment, the insulating film 28 may include a SiO$_2$ film 24 and a SiN film 26 sequentially formed on the single crystalline silicon substrate 20. In an example embodiment, the SiN film 26 has high interface contact with the silicon nanowire film 36.

In an example embodiment, the insulating film 28 and the silicon nanowire film 36 have the same line-width of 30 nm or less. In an example embodiment, the silicon nanowire film 36 has a length of 100 to 10000 nm.

In the silicon nanowire substrate having the above structure, the crystalline direction of the silicon crystal seed 29 epitaxially grown from the single crystalline silicon substrate 20 may be determined according to the crystalline direction of the single crystalline silicon substrate 20, and the crystalline direction of the silicon nanowire film 36 laterally crystallized from the silicon crystal seed 29 may be determined according to the crystalline direction of the silicon crystal seed 29. That is, the crystalline direction of the silicon nanowire film 36 may be controlled by controlling the crystalline direction of the silicon crystal seed 29, and the silicon nanowire film 36 can be provided with various characteristics depending on the crystalline direction.

FIGS. 3A through 3G are perspective views for explaining a method of manufacturing a silicon nanowire substrate according to an example embodiment of the present invention. In example embodiment of the present invention, a thin film may be manufactured using methods well known in the art, for example, CVD, PVD, or MOCVD.

Figure 3A:
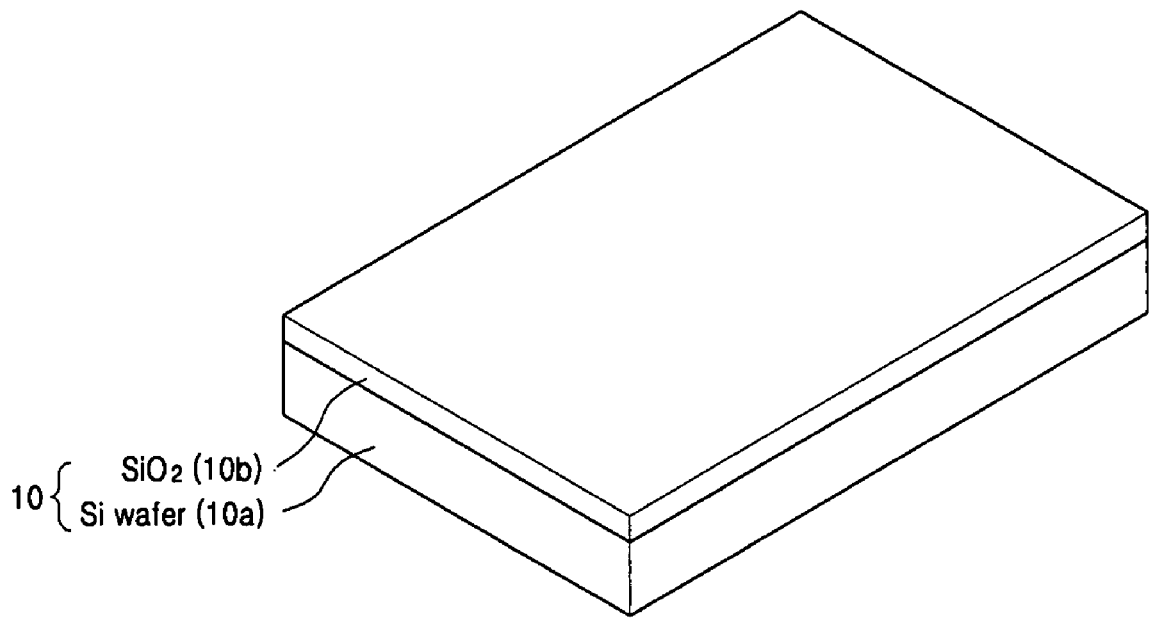
FIGS. 3A through 3G are perspective views for explaining a method of manufacturing a silicon nanowire substrate according to an example embodiment of the present invention.

Referring to FIG. 3A, the substrate 10 may be prepared. The substrate 10 may be formed of at least one material selected from the group consisting of silicon, oxidized silicon, quartz, glass, sapphire, and plastic. For example, the substrate 10 may be an oxidized Si substrate, and as depicted in FIG. 3A, may include a Si wafer 10a and a SiO$_2$ layer 10b formed on the Si wafer 10a.

Figure 3B:
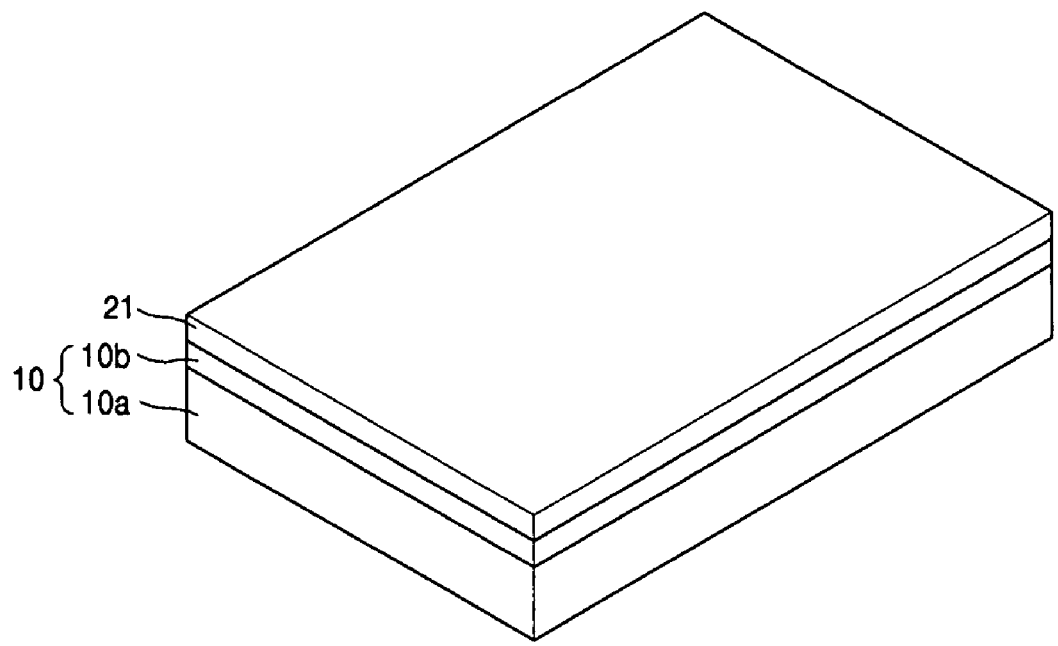
Figure 3C:
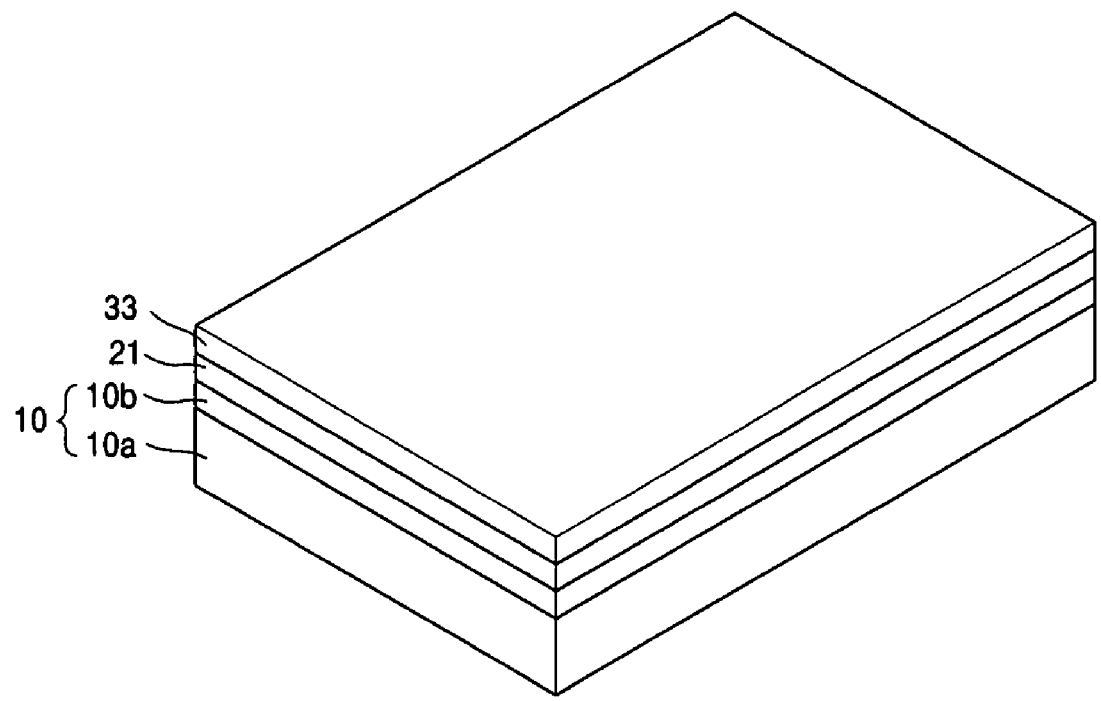

Referring to FIGS. 3B and 3C, an insulating film 21 and a silicon film 33 may be sequentially formed on the substrate 10. The insulating film 21 may be formed of SiN or SiO$_2$, and the silicon film 33 may be formed of poly crystalline silicon, poly-Si or amorphous silicon, a-Si. In an example embodiment, the insulating film 21 may be formed of SiN because SiN has high interface contact with the silicon film 33.

Figure 3D:
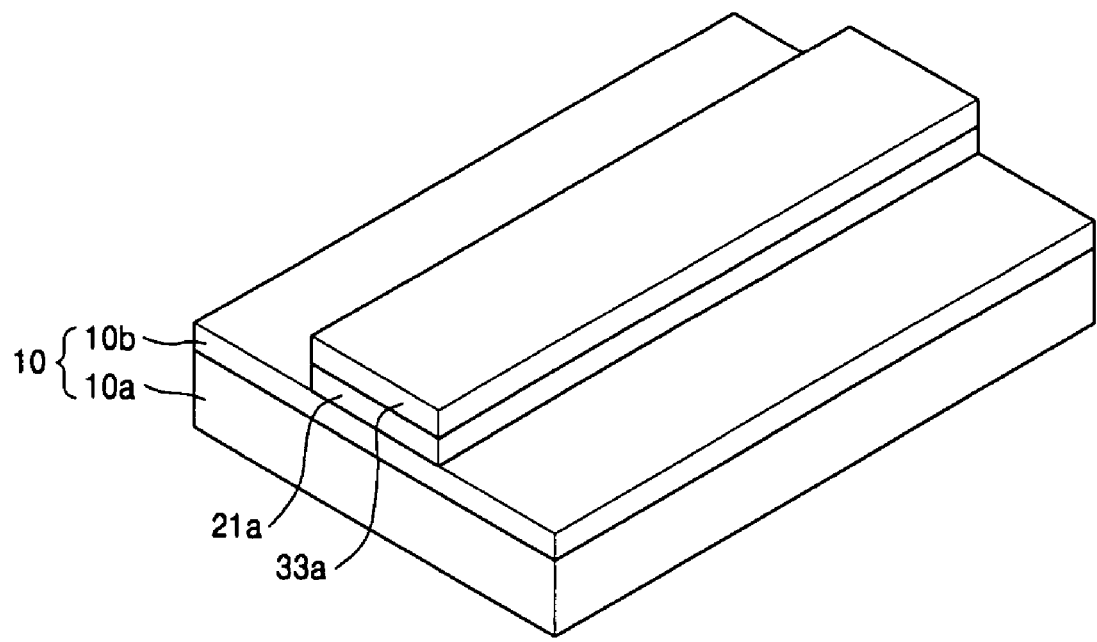

Referring to FIG. 3D, the insulating film 21 and the silicon film 33 may be patterned into a strip shape having the same line-width in the range of 20 to 300 nm. In an example embodiment, the insulating film 21 and the silicon film 33 may have the same length, in the range of 100 to 10000 nm. In an example embodiment, the patterning may be performed by reactive ion etching.

Figure 3E:
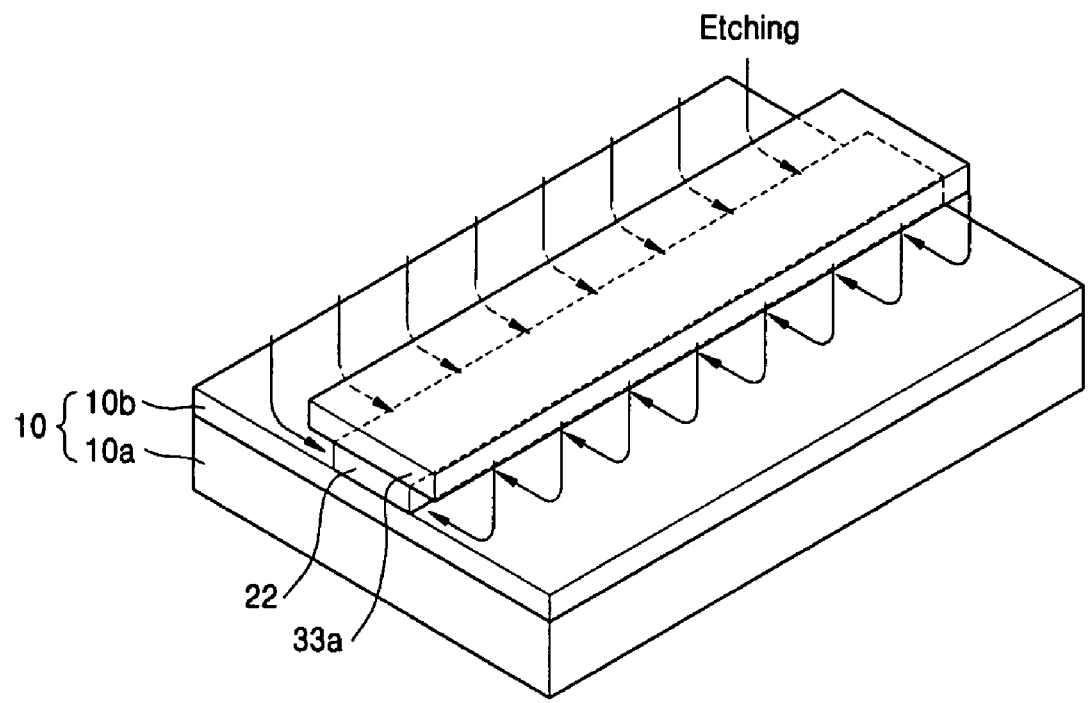

Referring to FIG. 3E, the line-width of the patterned insulating film 21a may be reduced by undercut etching both sides of the insulating film 21a. In an example embodiment, the lateral etching of the insulating film 21a may be performed by isotropic dry etching.

Figure 3F:
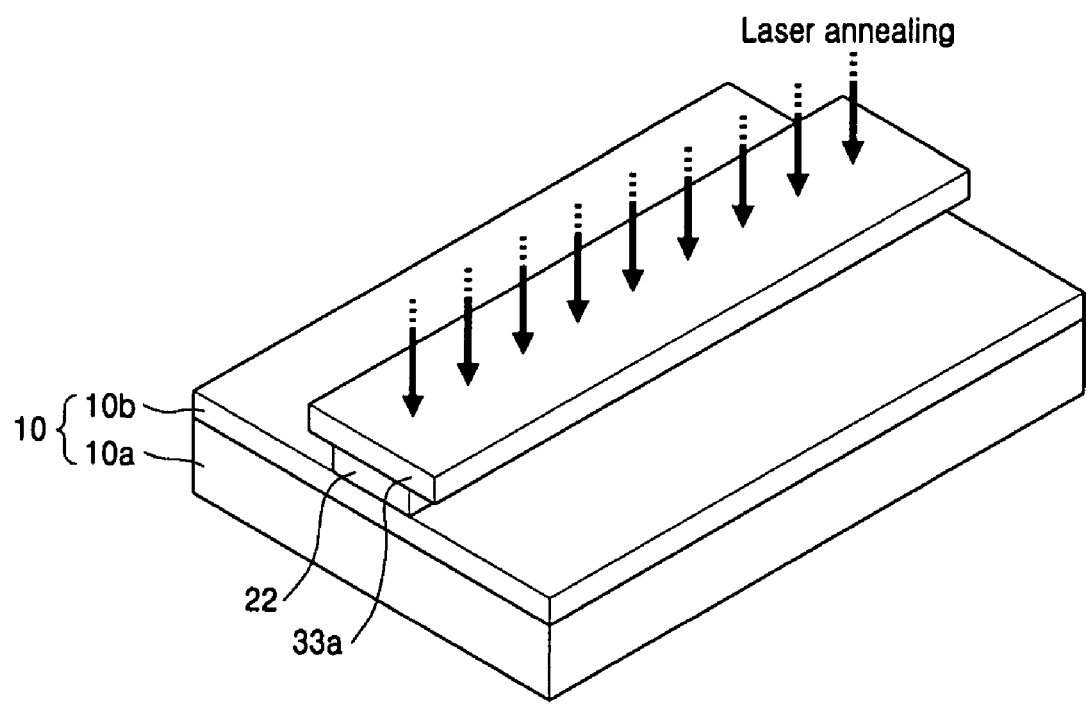
Figure 3G:
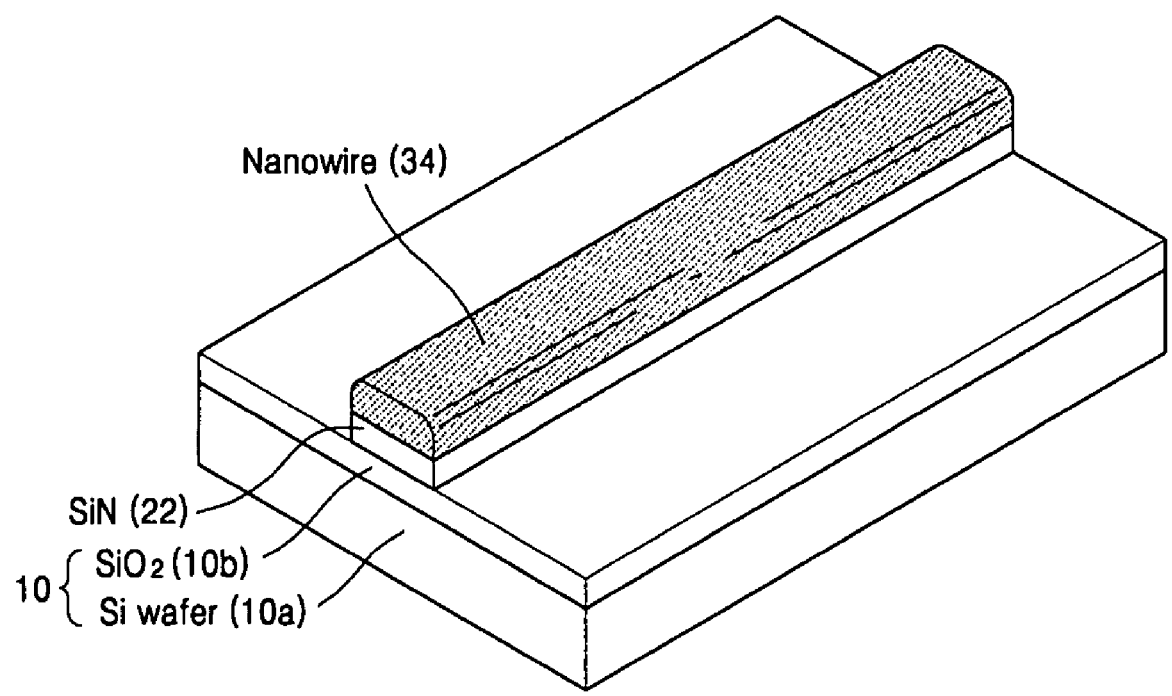

Referring to FIGS. 3F and 3G, the silicon film 33a may be melted by laser annealing. In an example embodiment, the surface energy of the melted silicon film 33a may be reduced by melting the silicon film 33a, so that the surface width of the melted silicon film 33a is reduced to the width of the insulating film 22 thereunder; however, the thickness of the silicon film 33a increases according to the volume conservation rule. By the same principle, the melted silicon film 33a may crystallize by self-aligning on the upper surface of the etched insulating film 22. Accordingly, a fine silicon nanowire film 34 can be obtained on the upper surface of the insulating film 22. In an example embodiment, the silicon nanowire film 34 obtained in this manner may be narrower than a silicon nanowire film patterned by conventional lithography.

In an example embodiment, the line-width of the silicon nanowire film 34 self aligned on the upper surface of the insulating film 22 may be finely controlled by finely controlling the line-width of the insulating film 22. In an example embodiment, the silicon nanowire film 34 may be formed with a line-width of 30 nm or less. In an example embodiment, when the nucleation rate of crystallizing silicon is controlled to 1 event/µs or less, the silicon nanowire film 34 may be single crystalline silicon. Accordingly, the single crystalline silicon nanowire film 34 may be used for a channel of a next generation transistor having improved device characteristics.

The nucleation rate will now be described in more detail. Generally, the nucleation rate of one mole of silicon is 1011 event/ns. If the volume of the silicon nanowire film is 30 nm (width)×30 nm (thickness)×1000 nm (length)=$9\times10^{-22}$ m$^3$, this corresponds to $7.5\times10^{-15}$ moles. Accordingly, the nucleation rate is $7.5\times10^{-15}$ moles×1011 event/ns, which is equivalent to 1 event/µs. Accordingly, a single crystalline silicon nanowire film may be formed by controlling the nucleation rate of the crystallizing silicon to 1 event/µs.

In an example embodiment, the silicon nanowire substrate having the above structure may provide a silicon nanowire film having a line-width of 30 nm or less, beyond the conventional lithographic resolution limit. In an example embodiment, the method of manufacturing the silicon nanowire film is simpler and the location of the silicon nanowire film on the substrate 10 may be readily controlled.

FIGS. 4A through 4J are perspective views for explaining a method of manufacturing a silicon nanowire substrate according to another embodiment of the present invention. In these processes, the thin film can be manufactured using methods well known in the art, such as CVD, PVD, or MOCVD.

Figure 4A:
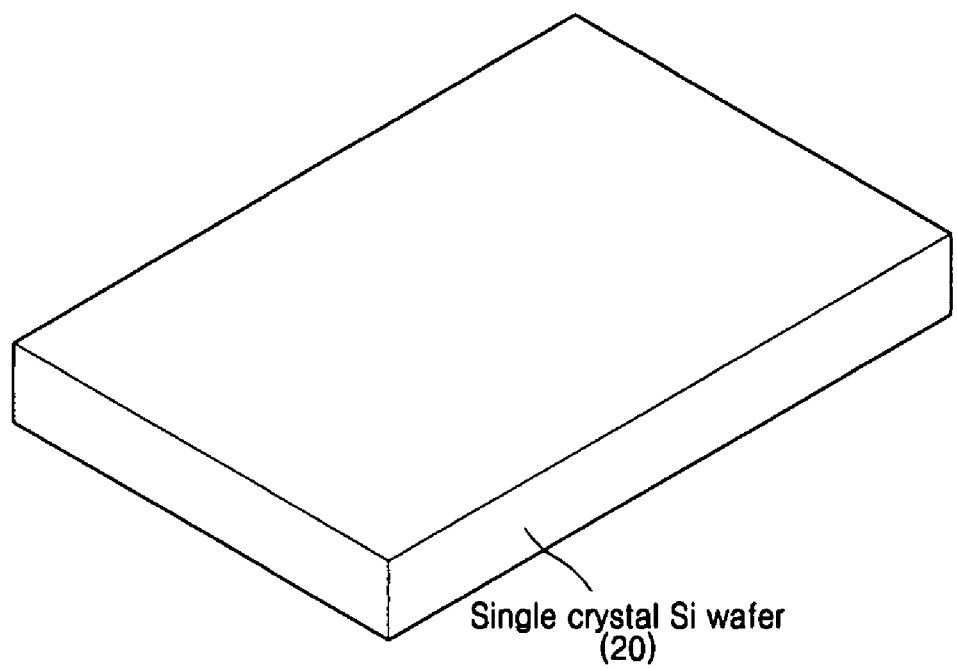
FIGS. 4A through 4J are perspective views for explaining a method of manufacturing a silicon nanowire substrate according to another example embodiment of the present invention.
Figure 4B:
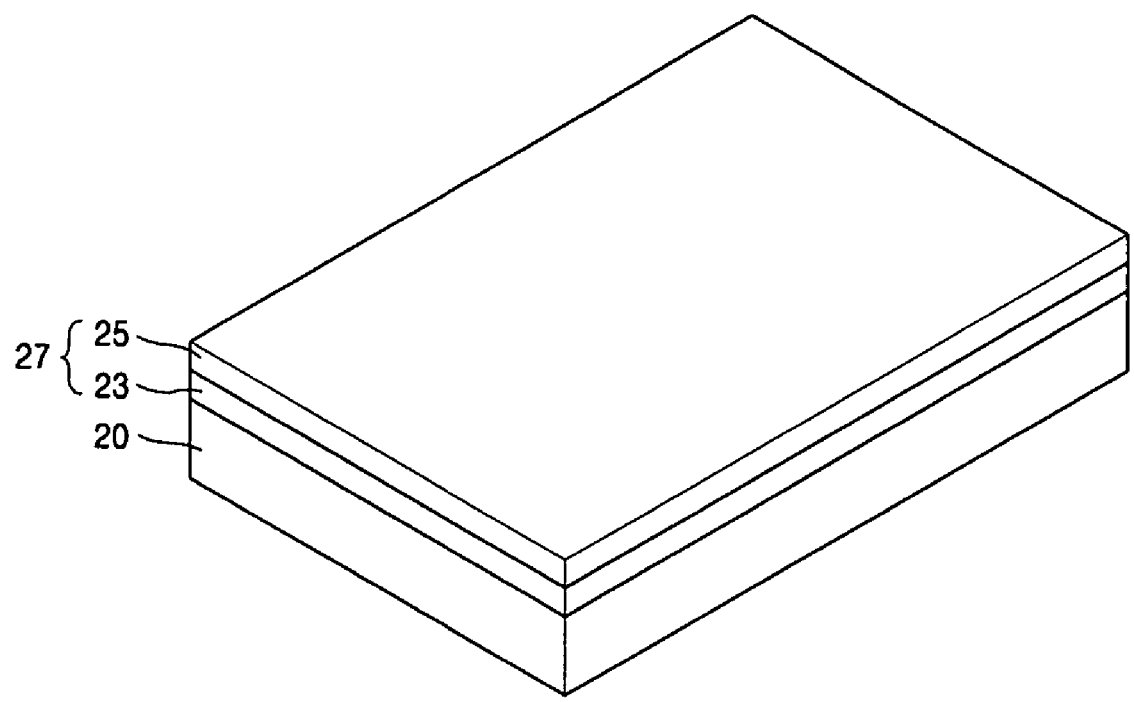

Referring to FIGS. 4A and 4B, after a single crystalline silicon substrate 20 is prepared, an insulating film 27 may be formed on the single crystalline silicon substrate 20. The insulating film 27 may be formed of SiN or SiO$_2$. In an example embodiment, the insulating film 27 may be formed by sequentially forming a SiO$_2$ film 23 and a SiN film 25 on the single crystalline silicon substrate 20. In an example embodiment, SiN has high interface contact with the silicon film.

Figure 4C:
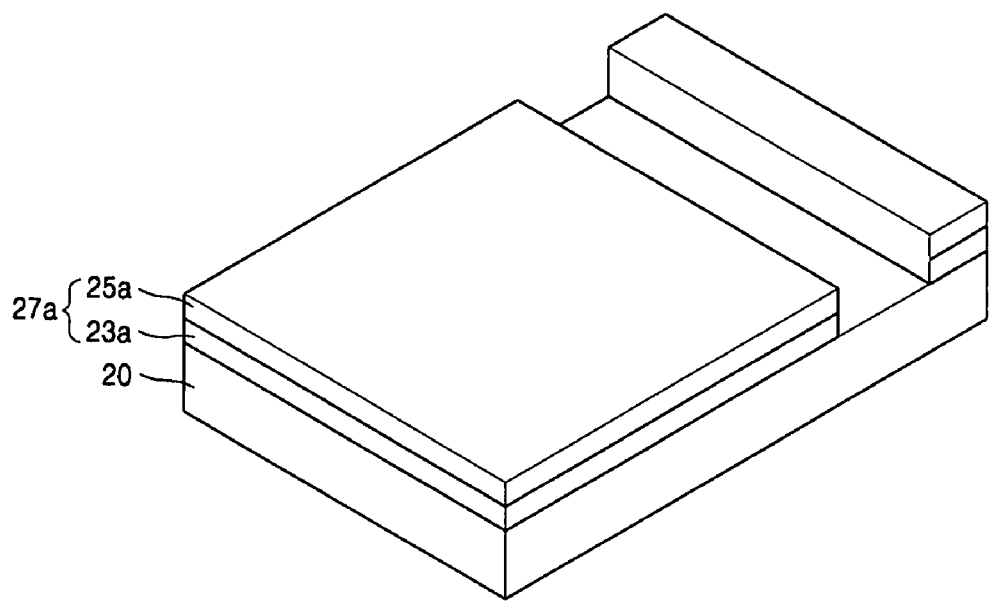
Figure 4D:
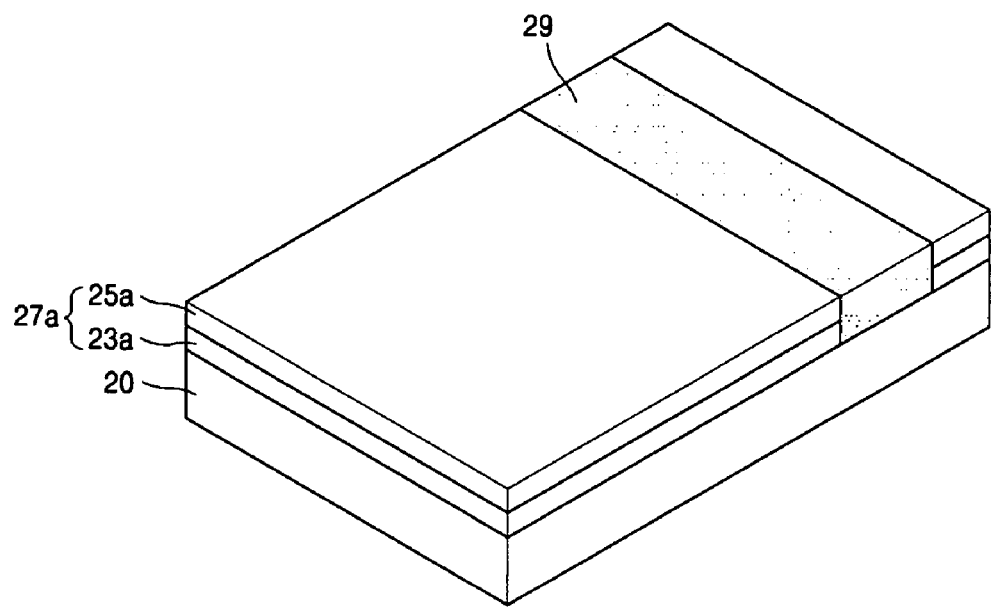

Referring to FIGS. 4C and 4D, a portion of the single crystalline silicon substrate 20 is exposed by etching a region of the insulating film 27. In an example embodiment, this process may be performed by reactive ion etching. Afterward, a silicon crystal seed 29 may be formed on the exposed surface of the single crystalline silicon substrate 20 by epitaxially growing silicon. In an example embodiment, the crystalline direction of the silicon crystal seed 29 epitaxially grown may vary according to the crystalline direction of the single crystalline silicon substrate 20, and the silicon crystal seed 29 may be formed to the same height as the etched insulating film 27a.

Figure 4E:
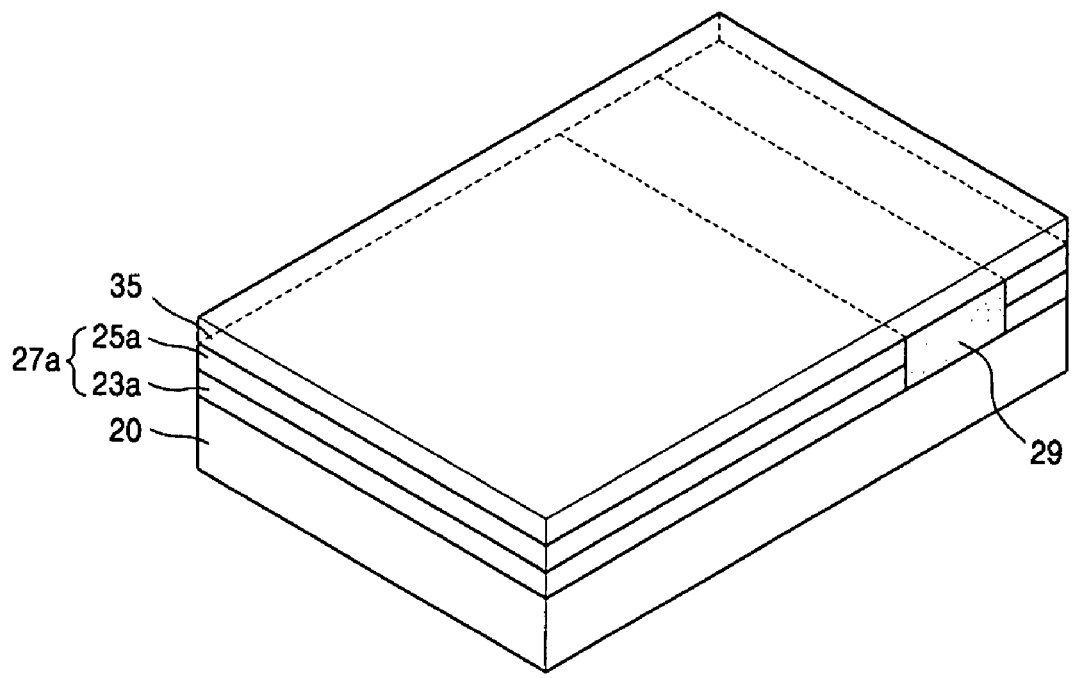
Figure 4F:
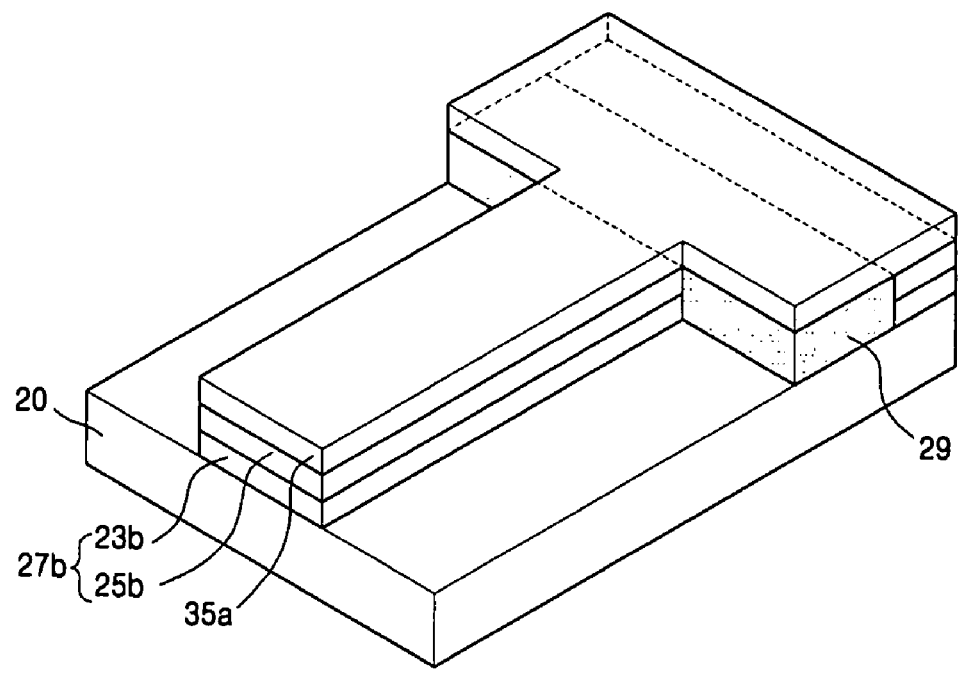

Referring to FIGS. 4E and 4F, a silicon film 35 may be formed on the insulating film 27a and the silicon crystal seed 29. In an example embodiment, the insulating film 27a and the silicon film 35 stacked on the insulating film 27a may be patterned into a strip shape. In an example embodiment, one end of the patterned insulating film 27b may contact the silicon crystal seed 29.

The insulating film 27b and the silicon film 35a stacked on the insulating film 27b may be patterned to have the same line-width in the range of 20 to 300 nm and/or the same length in the range of 100 to 10000 nm. The patterning can be performed by reactive ion etching.

Figure 4G:
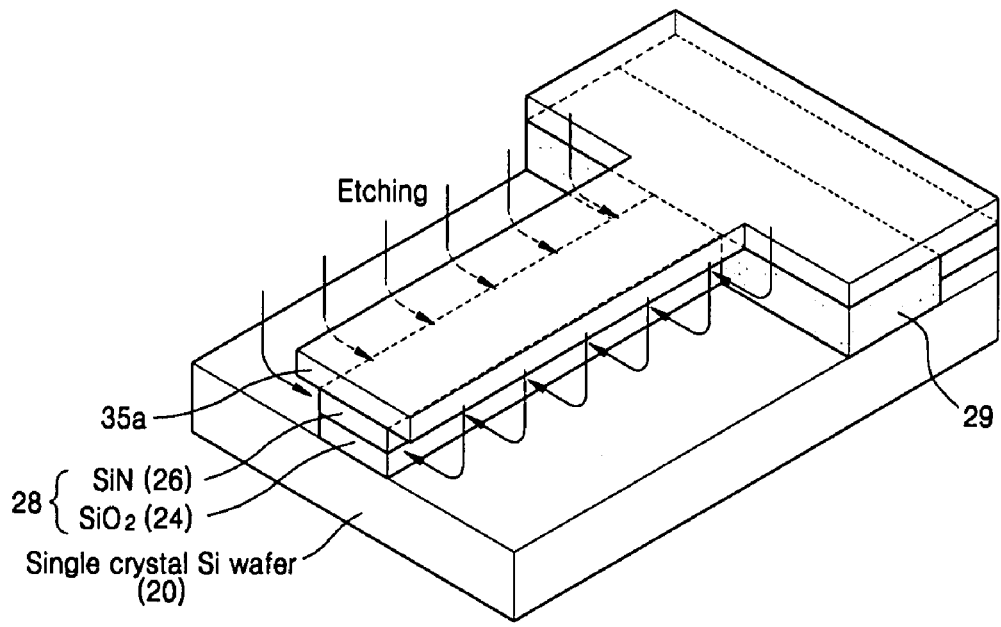

Referring to FIG. 4G, the line-width of the patterned insulating film 27b may be reduced by undercut etching both sides of the insulating film 27b. The lateral etching of the insulating film 27b may be performed by isotropic dry etching.

Figure 4H:
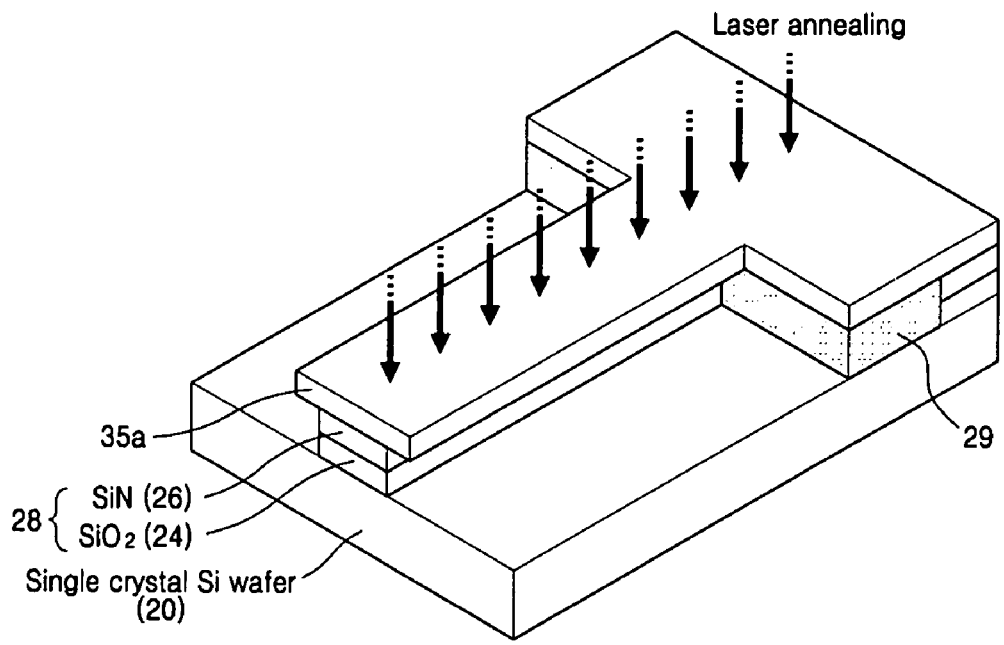
Figure 4I:
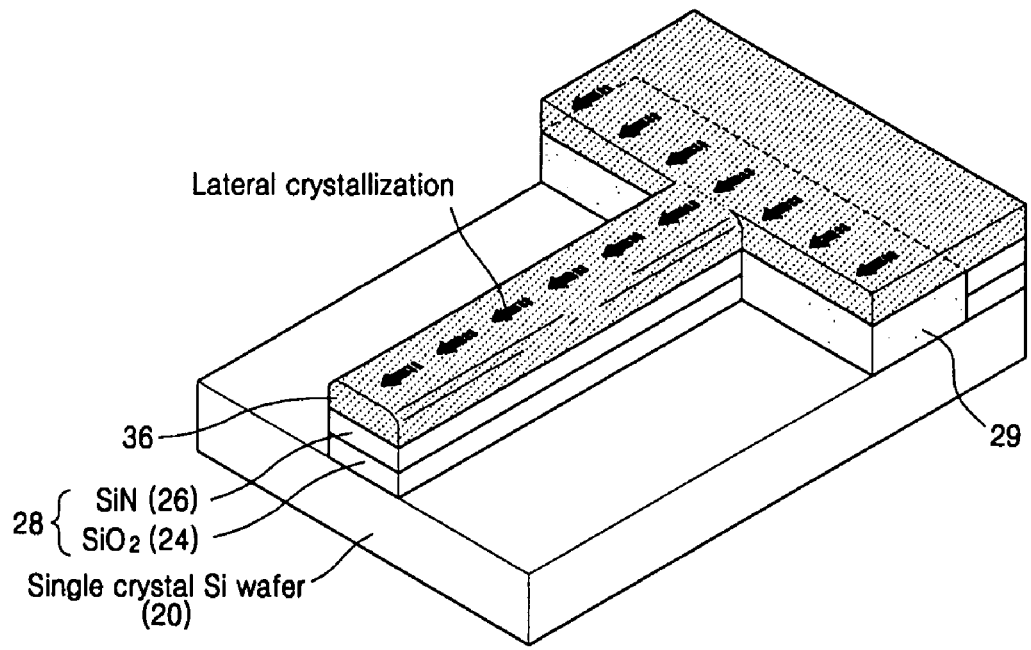
Figure 4J:
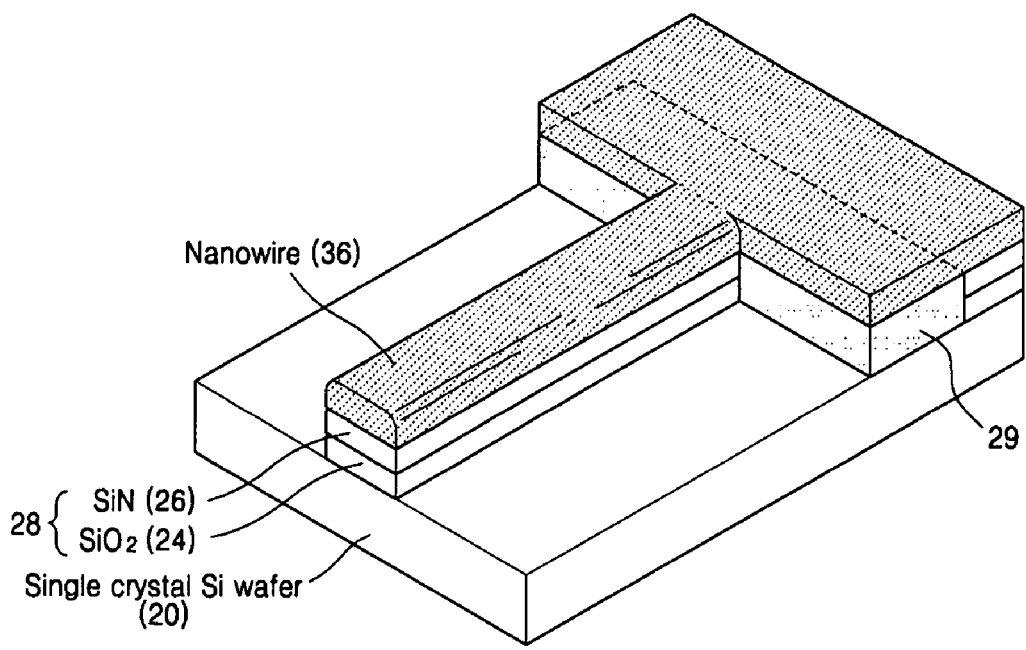

Referring to FIGS. 4H and 4J, a silicon film 35a formed on the laterally etched insulating film 28 and the silicon crystal seed 29 may be melted by laser annealing.

The surface energy of the melted silicon film 35a may be reduced by melting the silicon film 35a, because the surface width of the melted silicon film 35a is reduced to the width of the insulating film 28 thereunder; however, the thickness of the silicon film 35a increases according to the volume conservation rule. By the same principle, the melted silicon film 35a may crystallize while self-aligning on the upper surface of the etched insulating film 28. In an example embodiment, the melted silicon film 35a crystallizes from laterals, and a single crystalline silicon nanowire film 36 may be formed on the upper surface of the insulating film 28. In an example embodiment, in this process, the crystalline direction of the silicon nanowire film 36 may be controlled by controlling the crystalline direction of the silicon crystal seed 29, and the silicon nanowire film 36 may be provided various physical properties depending on the crystalline direction. Also, the crystalline direction of the silicon crystal seed 29 may be readily controlled according to the crystalline direction of the selected single crystalline silicon substrate.

In an example embodiment, the silicon nanowire film 36 can be formed to have a line-width of 30 nm or less. In an example embodiment, when the nucleation rate of the crystallizing silicon is controlled to 1 event/µs or less, the silicon nanowire film 36 may be formed into single crystalline silicon. Accordingly, the single crystalline silicon nanowire film 36 may be used for a channel of a next generation transistor having improved device characteristics.

The silicon nanowire film 36 obtained by the above method according to example embodiments of the present embodiment may be narrower than a silicon nanowire film patterned by conventional lithography. In example embodiments of the present invention, the line-width of the silicon nanowire film 36 self-aligned on the upper surface of the insulating film 28 may be controlled by controlling the line-width of the insulating film 28.

FIGS. 5A through 5E are perspective views for explaining an example method of manufacturing a thin film transistor using the silicon nanowire substrate manufactured by the processes depicted in FIGS. 3A through 3G.

Figure 5A:
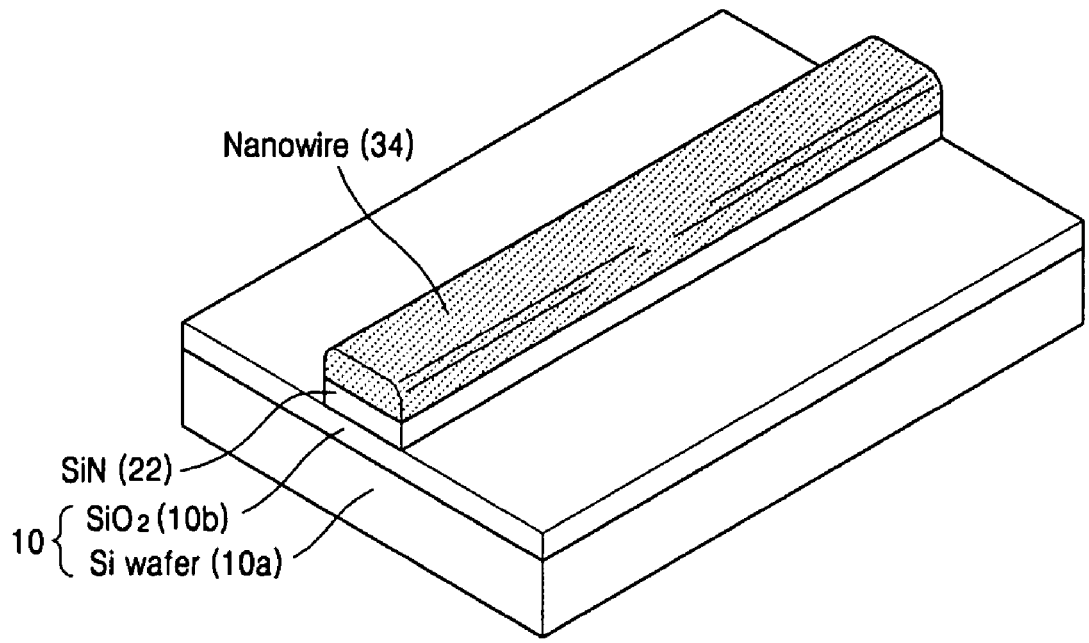
FIGS. 5A through 5E are perspective views for explaining an example method of manufacturing a thin film transistor using the silicon nanowire substrate manufactured by the processes depicted in FIGS. 3A through 3G.

Referring to FIG. 5A, a silicon nanowire substrate may be manufactured by the processes depicted in FIGS. 3A through 3G.

Figure 5B:
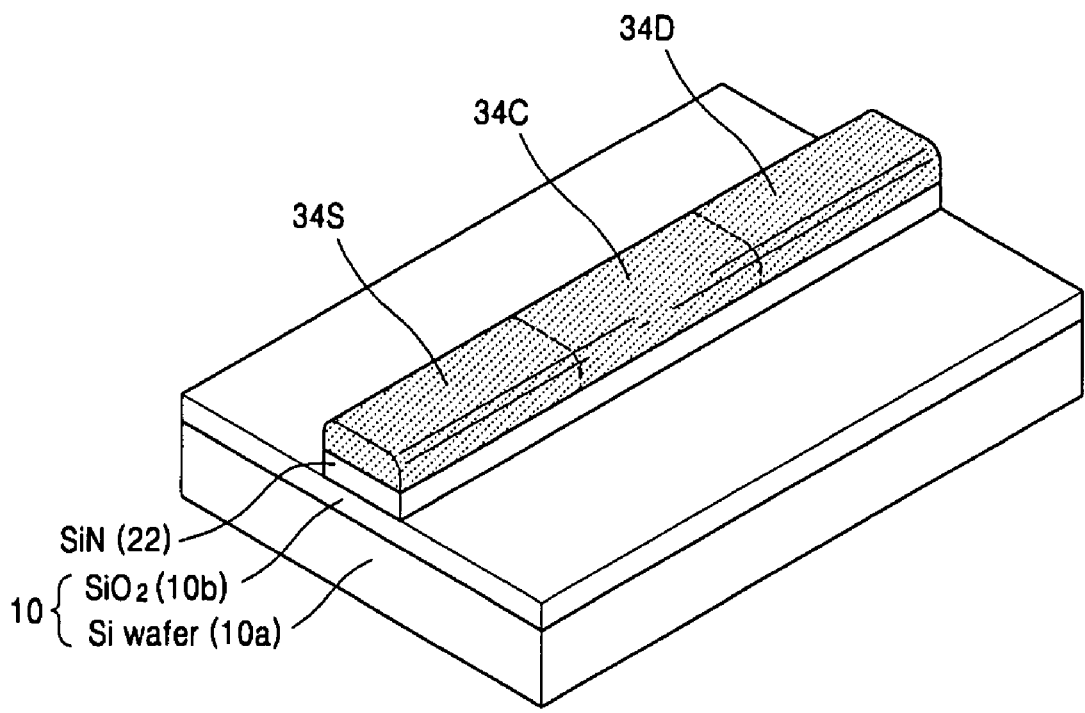

Referring to FIG. 5B, a source 34S, a drain 34D, and a channel region 34C may be defined on a silicon nanowire film 34 formed on the substrate.

Figure 5C:
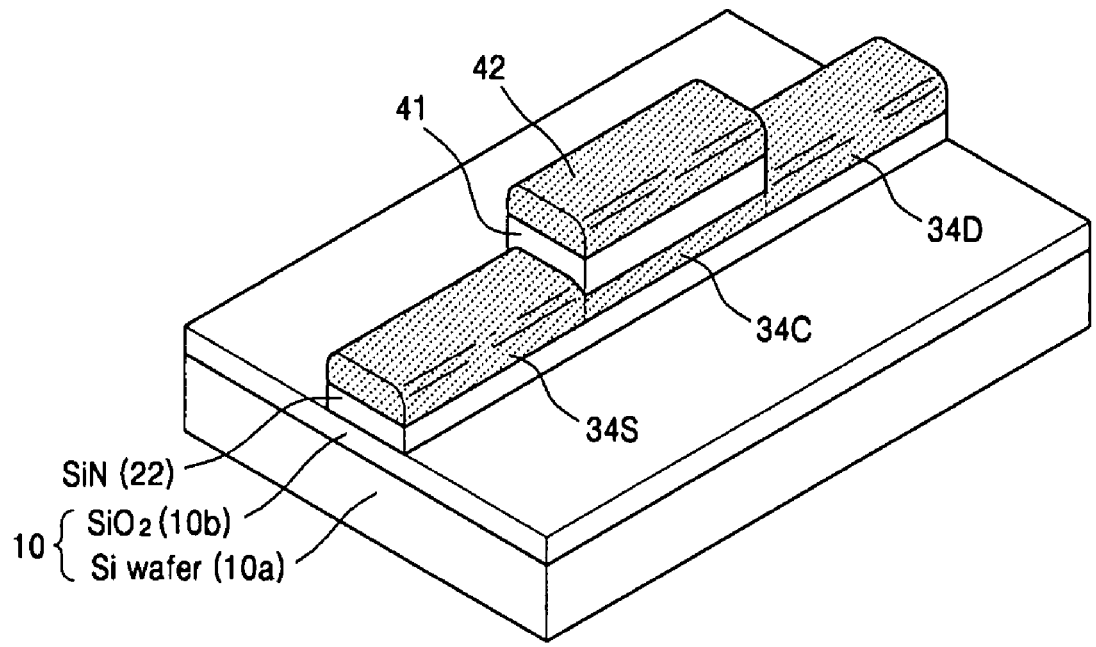

Referring to FIG. 5C, a gate insulating film 41 and a gate electrode 42 may be sequentially formed on the channel region 34C. In an example embodiment, the gate insulating film 41 may be formed of SiO$_2$ or HfO$_2$. In an example embodiment, the gate electrode 42 may be formed of a metal, for example, Al or Cr.

Figure 5D:
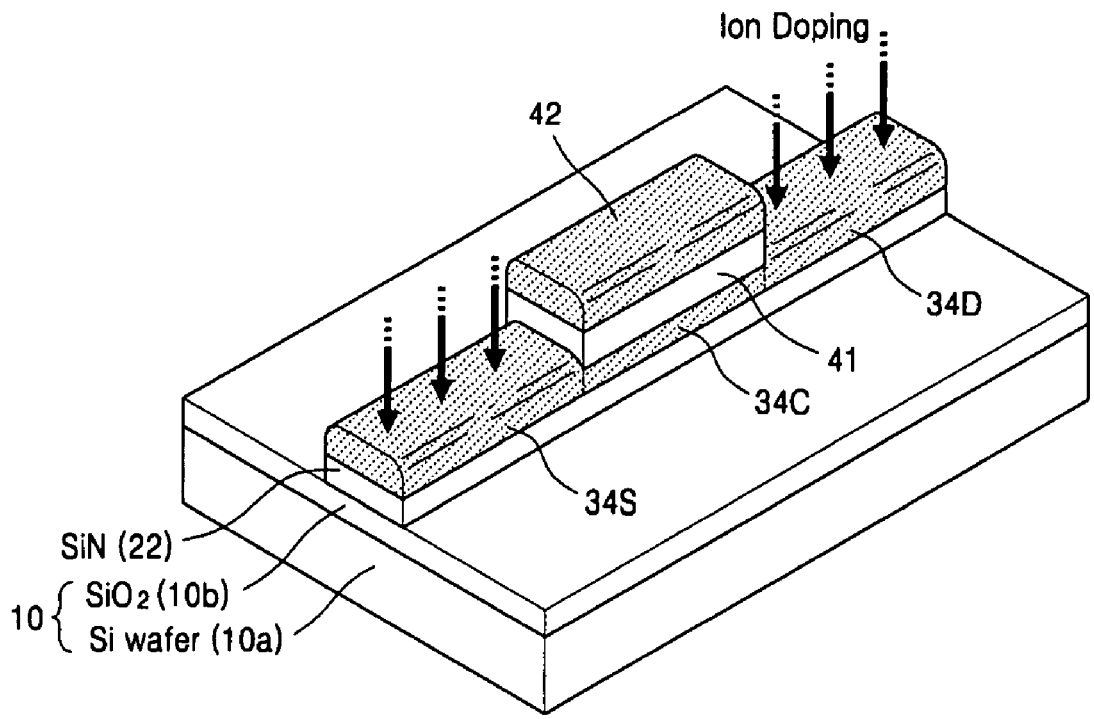
Figure 5E:
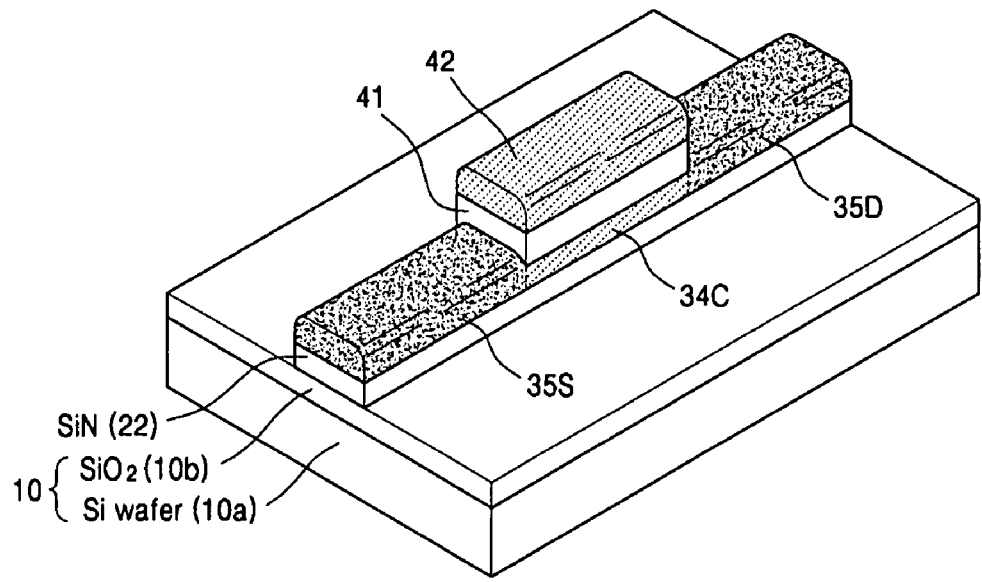

Referring to FIGS. 5D and 5E, a conductive dopant may be added to the source 34S and the drain 34D regions, to produce a thin film transistor that uses the silicon nanowire substrate according to an example embodiment of the present invention.

FIGS. 6A through 6E are perspective views for explaining an example method of manufacturing a thin film transistor using the silicon nanowire substrate manufactured by the processes depicted in FIGS. 4A through 4J.

Figure 6A:
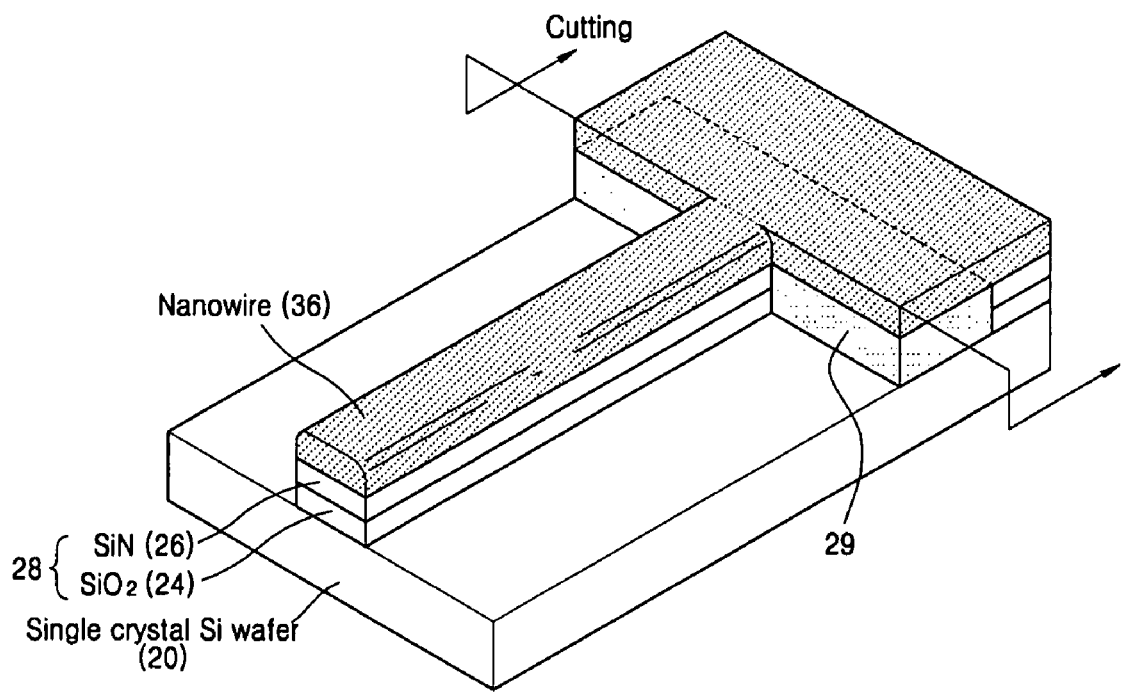
FIGS. 6A through 6E are perspective views for explaining an example method of manufacturing a thin film transistor using the silicon nanowire substrate manufactured by the processes depicted in FIGS. 4A through 4J.

Referring to FIG. 6A, a silicon nanowire substrate may be manufactured by the process depicted in FIGS. 4A through 4J. A silicon nanowire film 36 formed on the substrate may be cut to the desired size. For example, the silicon crystal seed 29 side may be cut and removed because the silicon crystal seed 29 is not needed for forming a thin film transistor.

Figure 6B:
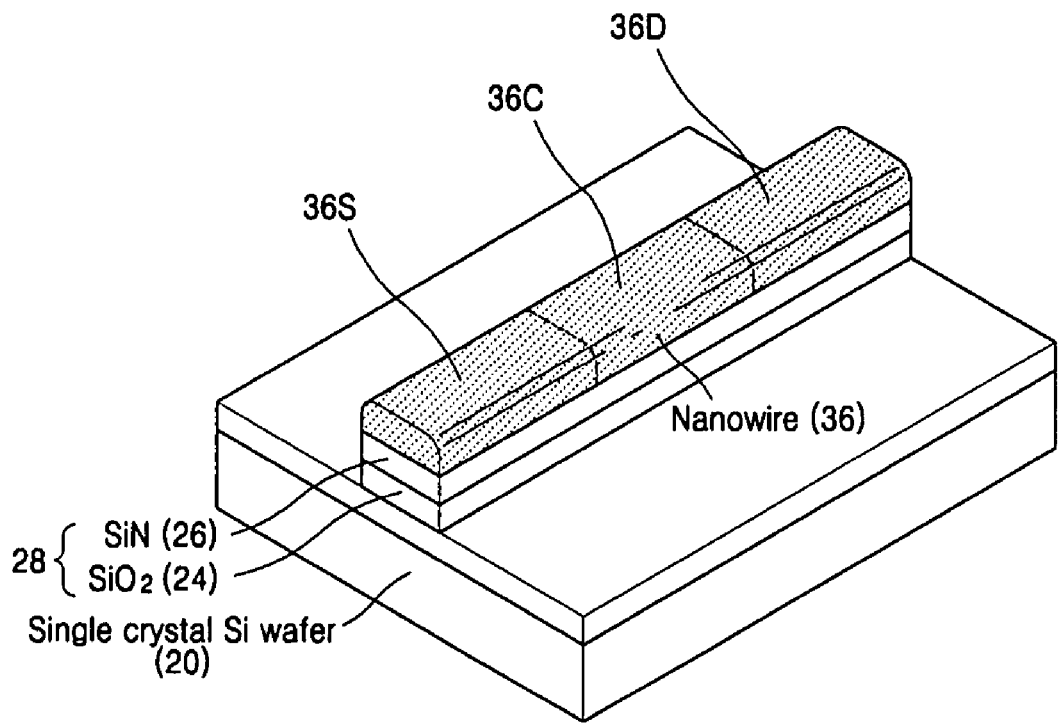

Referring to FIG. 6B, a source 36S, a drain 36D, and a channel region 36C may be defined on the silicon nanowire film 36 formed on the substrate.

Figure 6C:
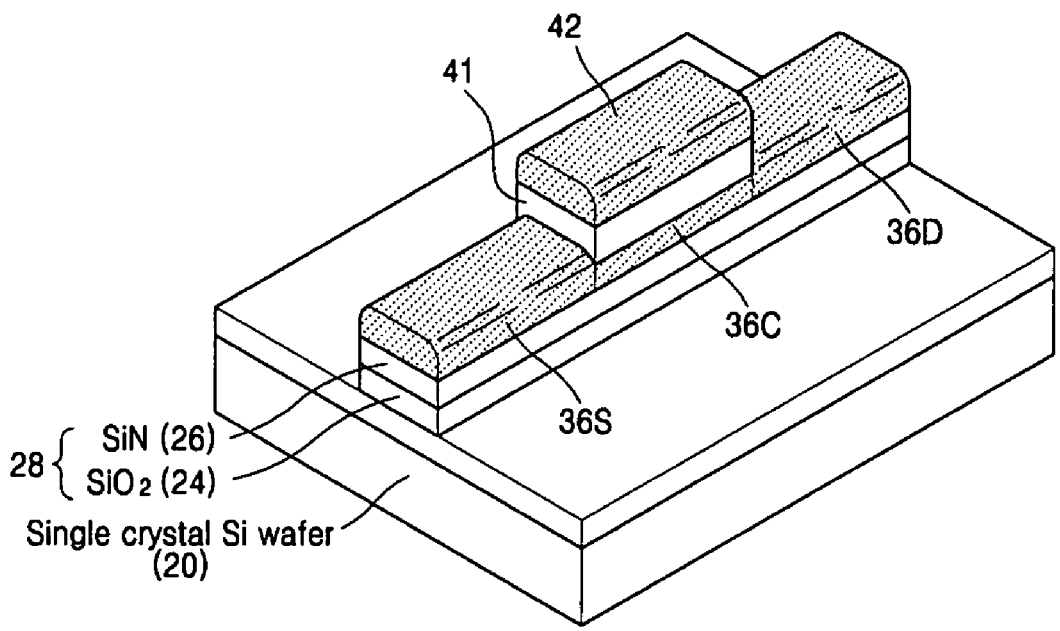

Referring to FIG. 6C, a gate insulating film 41 and a gate electrode 42 may be sequentially formed on the channel region 36C. In an example embodiment, the gate insulating film 41 may be formed of $SiO_2$ or $HfO_2$. In an example embodiment, the gate electrode 42 may be formed of a metal, for example, Al or Cr.

Figure 6D:
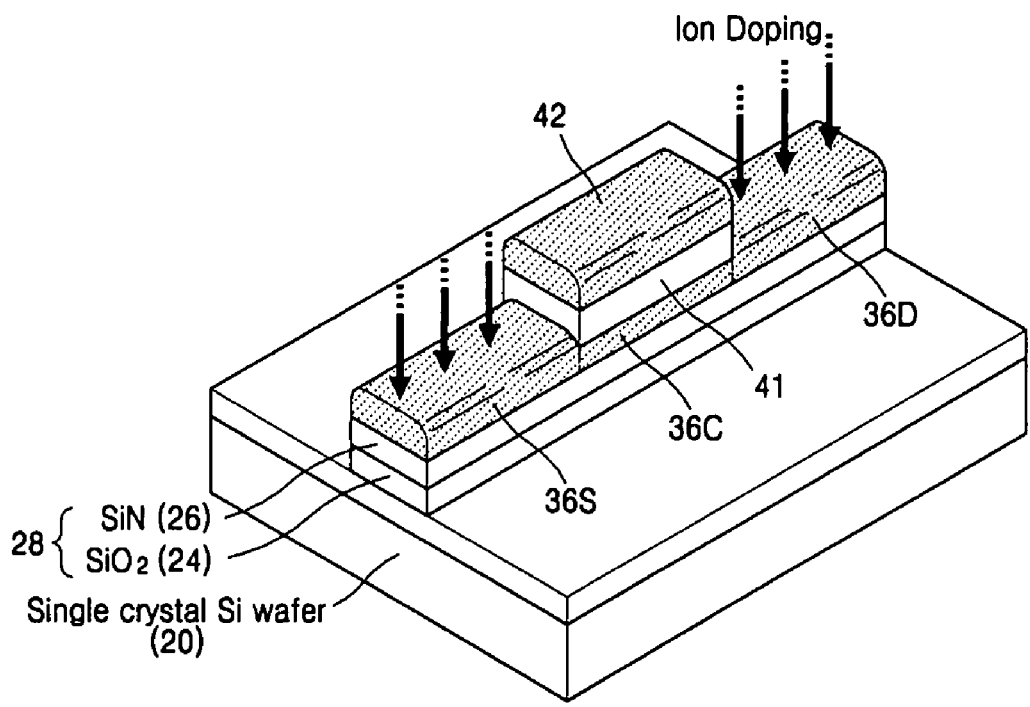
Figure 6E:
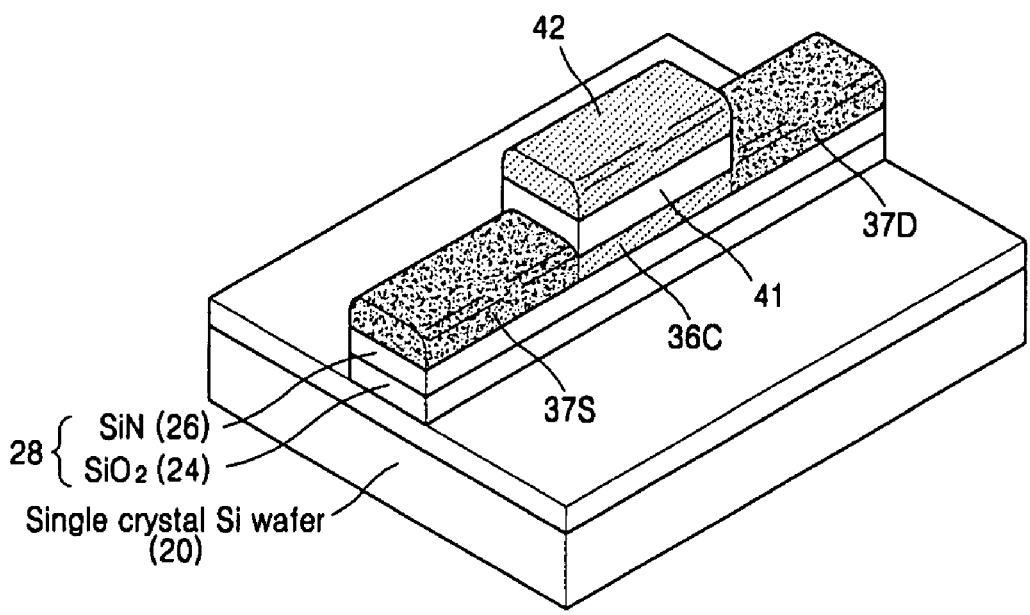

Referring to FIGS. 6D and 6E, a conductive dopant may be added to the source 36S and the drain 36D regions, to produce a thin film transistor that uses the silicon nanowire substrate according to example embodiments of the present invention.

According to example embodiments of the present invention, a silicon nanowire substrate having the above structure may provide a silicon nanowire film having a line-width of 30 nm or less, beyond the conventional lithographic resolution limit. The example processes for manufacturing the silicon nanowire film are simpler and the location of the silicon nanowire film on the substrate can be readily controlled. In example embodiments, the silicon nanowire film may be formed of single crystalline silicon by controlling the nucleation rate of the crystallizing silicon. A single crystalline silicon nanowire film has a smaller parasitic capacitance and/or higher carrier mobility. Accordingly, a single crystalline silicon nanowire film may be used as a transistor channel of a next generation transistor having improved device characteristics.

While the present invention has been particularly shown and described with reference to example embodiments thereof, it will be understood by those of ordinary skill in the art that various changes in form and detail may be made therein without departing from the spirit and scope of the present invention as defined by the following claims.

What is claimed is:

1. A silicon nanowire substrate comprising: a substrate; an insulating film formed on the substrate in a strip shape such that all side surfaces of the strip shape meet a bottom surface of the strip shape, the insulating film having exposed side surfaces; and a silicon nanowire film covering an uppermost surface of the insulating film and having sidewalls aligned with the exposed side surfaces of the insulating film, wherein the silicon nanowire film is single crystalline silicon.

2. The silicon nanowire substrate of claim 1, wherein the insulating film and the silicon nanowire film have a line-width of 30 nm or less.

3. The silicon nanowire substrate of claim 1, wherein the insulating film and the silicon nanowire film have the same line-width.

4. The silicon nanowire substrate of claim 1, wherein the silicon nanowire film has a length in the range of 100 to 10000 nm.

5. The silicon nanowire substrate of claim 1, wherein the substrate is formed of at least one material selected from the group consisting of silicon, oxidized silicon, quartz, glass, sapphire, and plastic.

6. The silicon nanowire substrate of claim 1, wherein the insulating film is formed of at least one material selected from SiN or $SiO_2$.

7. The silicon nanowire substrate of claim 1, wherein
the substrate is a single crystalline silicon substrate and the insulating film is formed on the single crystalline silicon substrate, the silicon nanowire substrate further comprising:
a silicon crystal seed which is epitaxially grown on the single crystalline silicon substrate and contacts one end of the insulating film and
wherein the silicon nanowire film is laterally crystallized from the silicon crystal seed, covers an upper surface of the insulating film, and has an extension part which contacts the silicon crystal seed.

* * * * *